United States Patent [19]

Hase et al.

[11] Patent Number: 5,279,996
[45] Date of Patent: Jan. 18, 1994

[54] PIEZOELECTRIC CERAMIC COMPOSITION

[75] Inventors: Kiyoshi Hase; Toshihiko Kittaka; Yukio Sakabe, all of Nagaokakyo, Japan

[73] Assignee: Murata Manufacturing Co., Ltd., Japan

[21] Appl. No.: 917,829

[22] Filed: Jul. 21, 1992

[30] Foreign Application Priority Data

Jul. 23, 1991 [JP] Japan ................... 3-206422
Apr. 14, 1992 [JP] Japan ................... 4-121400

[51] Int. Cl.$^5$ ............................ C04B 35/49
[52] U.S. Cl. ..................... 501/136; 252/62.9
[58] Field of Search ............ 501/136, 137, 138, 139; 252/62.9

[56] References Cited

U.S. PATENT DOCUMENTS

| | | | |
|---|---|---|---|
| 3,856,693 | 12/1974 | Kim | 252/62.9 PZT |
| 3,899,435 | 8/1975 | Minai et al. | 252/62.9 PZT |
| 3,956,150 | 5/1976 | Ouchi et al. | 252/62.9 PZT |
| 3,963,630 | 6/1976 | Yonezawa et al. | 252/62.9 |
| 3,963,631 | 6/1976 | Ouchi et al. | 252/62.9 PZT |
| 4,568,848 | 2/1986 | Ogawa | 252/62.9 PZT |

FOREIGN PATENT DOCUMENTS

| | | | |
|---|---|---|---|
| 0012583 | 6/1980 | European Pat. Off. | 252/62.9 PZT |
| 2164403 | 8/1972 | Fed. Rep. of Germany . | |
| 2210586 | 7/1974 | France . | |
| 0396277 | 5/1964 | Japan . | |
| 0053299 | 4/1979 | Japan | 252/62.9 PZT |
| 0053398 | 4/1979 | Japan | 252/62.9 PZT |
| 0100980 | 6/1982 | Japan | 501/134 |
| 1105881 | 5/1986 | Japan | 252/62.9 PZT |
| 64-10955 | 2/1989 | Japan . | |
| 0112104 | 4/1990 | Japan | 252/62.9 PZT |
| 7613167 | 11/1976 | Netherlands . | |
| 539010 | 12/1977 | U.S.S.R. | 252/62.9 PZT |
| 1008200 | 3/1983 | U.S.S.R. | 252/62.9 PZT |
| 1077868 | 3/1984 | U.S.S.R. | 252/62.9 PZT |

OTHER PUBLICATIONS

Tate, et al., Lead zirconate titanate piezoelectric materials., "Chemical Abstracts", vol. 108, No. 4 (Jan. 1988).
Database WPI (Jan. 30) JP53019797, Jun. 1978.

Primary Examiner—Mark L. Bell
Assistant Examiner—Deborah Jones
Attorney, Agent, or Firm—Ostrolenk, Faber, Gerb & Soffen

[57] ABSTRACT

A piezoelectric ceramic composition in which 0.1 to 8 mole % of a Pb atom in lead titanate zirconate is replaced with at least one of Ba, Sr and Ca, and which contains 0.5 to 1.9% by weight of at least one of Sb, Nb and Ta when respectively converted into $Sb_2O_3$, $Nb_2O_5$ and $Ta_2O_5$, contains 0.1 to 0.8% by weight of at least one of Cr, Fe and Mn when respectively converted into $Cr_2O_3$, $Fe_2O_3$ and $MnO_2$, and contains 0.001 to 0.25% by weight of at least one of Si and Ge when respectively converted into $SiO_2$ and $GeO_2$.

12 Claims, 3 Drawing Sheets

PIEZOELECTRIC CERAMIC COMPOSITION

BACKGROUND OF THE INVENTION

1. Field of the Invention

The present invention relates to a piezoelectric ceramic composition used as a material for a piezoelectric ceramic element such as a ceramic filter, a ceramic oscillator or the like.

2. Description of the Related Art

As a piezoelectric ceramic used for a ceramic filter or the like, a piezoelectric ceramic mainly composed of lead titanate zirconate (Pb $(Ti_X Zr_{1-X}) O_3$) has been widely used, and a piezoelectric ceramic to which small amounts of various additives are added so as to improve the piezoelectric characteristics thereof has been used.

Particularly as a piezoelectric ceramic for a ceramic filter having flat group delay time (GDT) characteristics and causing low phase distortion, one having a small mechanical quality factor Qm has been required. As this piezoelectric ceramic having a small Qm value, a piezoelectric ceramic in which niobium oxide, antimony oxide, tantalum oxide and the like are added as additives to lead titanate zirconate (Pb $(Ti_{X}Zr_{1-X})O_3$) has been known.

However, many examples of the above described conventional piezoelectric ceramic composition having a small Qm value are those having a piezoelectric d constant increased for an actuator and those having an electromechanical coupling factor K increased for a wide band filter, so that they are insufficiently heat proof. Consequently, the conventional piezoelectric ceramic composition has the disadvantage in that where it is used as a surface mounted type ceramic filter element, if it is exposed to high temperatures in the reflow soldering process, the electromechanical coupling factor K thereof is significantly lowered, so that the filter characteristics thereof are largely degraded.

Furthermore, the above described piezoelectric ceramic composition having a small Qm value has the disadvantage in that it generally has low mechanical strength, so that it is liable to be cracked or chipped in the process of processing as a filter element.

SUMMARY OF THE INVENTION

An object of the present invention is to provide a piezoelectric ceramic composition having high mechanical strength, having a small mechanical quality factor Qm, and having an electromechanical coupling factor K whose rate of decrease at high temperatures is low and particularly, a piezoelectric ceramic composition for a ceramic filter element having flat group delay time characteristics, causing low phase distortion, and capable of coping with surface mounting.

A piezoelectric ceramic composition according to the present invention is one mainly composed of lead titanate zirconate represented by Pb $(Ti_X Z_{1-X}) O_3$ (where X=0.48 to 0.55). According to the present invention, 0.1 to 8 mole % of the Pb in the titanate zirconate is replaced with at least one element selected from the group consisting of Ba, Sr and Ca. In addition, according to the present invention, the piezoelectric ceramic composition contains 0.5 to 1.9% by weight of at least one element selected from the group consisting of Sb, Nb and Ta when respectively converted into $Sb_2O_3$, $Nb_2O_5$ and $Ta_2O_5$, contains 0.1 to 0.8% by weight of at least one element selected from the group consisting of Cr, Fe and Mn when respectively converted into $Cr_2O_3$, $Fe_2O_3$ and $MnO_2$, and contains 0.001 to 0.25% by weight of at least one element selected from the group consisting of Si and Ge when respectively converted into $SiO_2$ and $GeO_2$.

In the piezoelectric ceramic composition according to the present invention, the electromechanical coupling factor K is increased to one for practical applications, the rate of decrease of K at high temperatures is lowered, and the mechanical quality factor Qm is decreased by adding to lead titanate zirconate (PZT) on the tetragonal ferroelectric phase (tetragonal phase) side from a phase transition boundary (MPB) at least one of Sb, Nb and Ta and further adding at least one of Cr, Fe and Mn. According to the present invention, the mechanical strength is also improved by adding a small amount of at least one of Si and Ga.

The piezoelectric ceramic composition according to the present invention has superior properties particularly as a material for a ceramic filter element, and can be used as a suitable material for a ceramic filter element in the above described composition or in combination with another component or another material as required.

In the piezoelectric ceramic composition according to the present invention, the electromechanical coupling factor K is as large as one for practical applications, and the rates of variation with temperature of a resonance frequency and an antiresonance frequency are low, and the mechanical quality factor Qm can be arbitrarily selected in the lower range of, for example, not more than 400. Consequently, when the piezoelectric ceramic composition according to the present invention is used as a material for a ceramic filter element such as a piezoelectric filter, one having flat group delay time (GDT) characteristics and causing low phase distortion can be arbitrarily selected in accordance with the desired use.

Furthermore, the piezoelectric ceramic composition according to the present invention is higher in mechanical strength than the conventional piezoelectric ceramic having a small mechanical quality factor Qm. Accordingly, it is possible to significantly improve the yield of products by restraining cracking or chipping occurring in the process of processing as a ceramic filter element.

Additionally, the piezoelectric ceramic composition according to the present invention has a high Curie temperature of not less than 250° C., and has an electromechanical coupling factor K whose rate of decrease up to the vicinity of the Curie temperature is low. Consequently, when the piezoelectric ceramic composition according to the present invention is used as a material for a filter element mounted on the surface by reflow soldering or the like, it is possible to restrain the degradation of the characteristics due to, for example, exposure to a high temperature of 250° C. and particularly, the shift of the pass band of the filter and the decrease of the pass bandwidth thereof. Accordingly, the piezoelectric ceramic composition according to the present invention is particularly useful as a material for a surface mounted type ceramic filter element.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
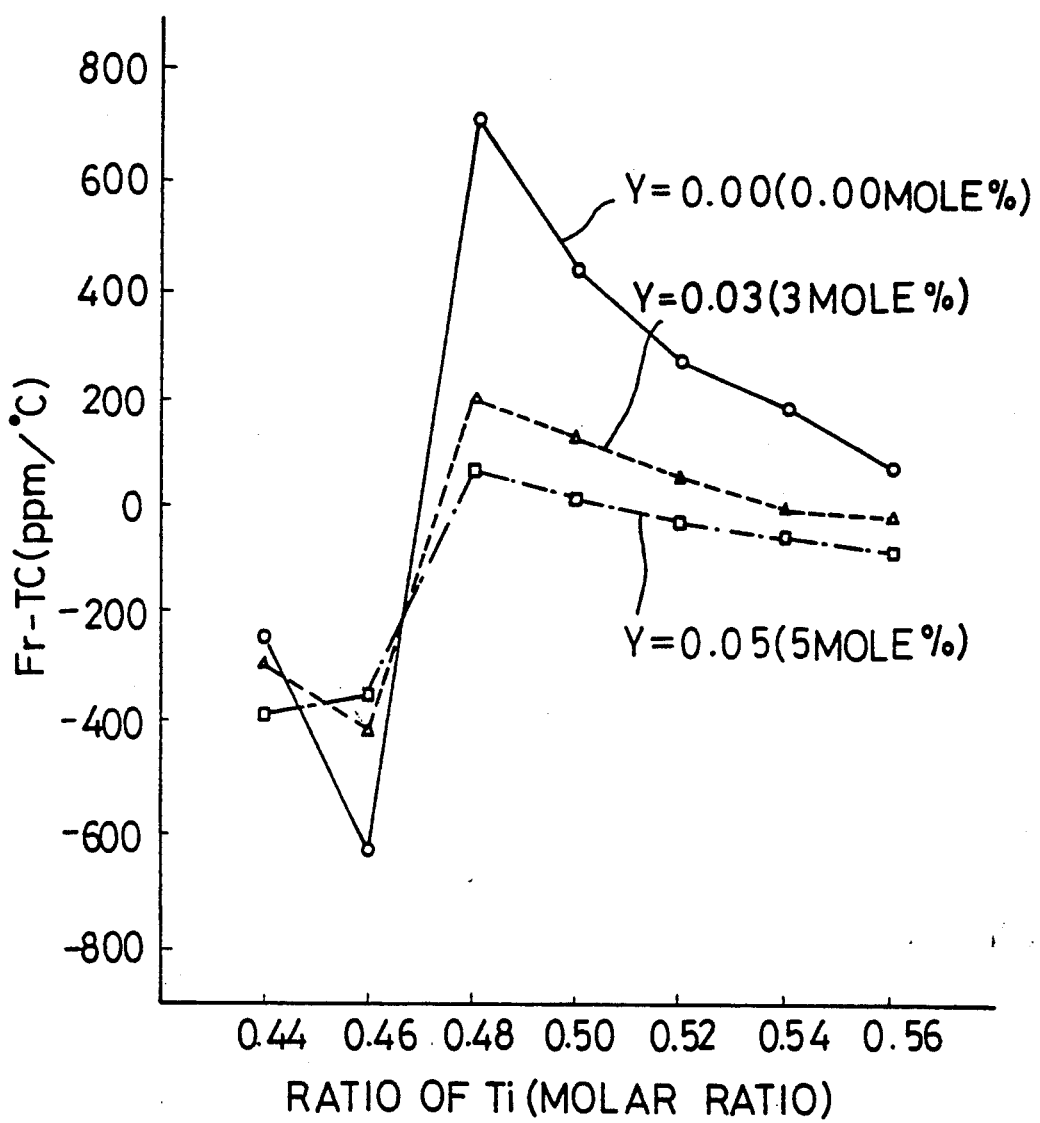
FIG. 1 is a diagram showing the relationship between a molar ratio of Ti and Zr and (Fr - TC) (the rate of variation with temperature of a resonance frequency Fr at temperatures of $-20°$ to $80°$ C.) with respect to the amounts of replacement of Pb with Sr, etc.

Respective components such as PbO, $TiO_2$, $ZrO_2$, $SrCO_3$, $CACO_3$, $BACO_3$, $Sb_2O_3$, $Cr_2O_3$, $Fe_2O_3$, $MnO_2$, $SiO_2$ and $GeO_2$ which are materials constituting a piezoelectric ceramic composition were weighed at predetermined ratios, and water was added thereto, followed by wet mixing using a ball mill. A mixture obtained by the wet mixing was then dried and then, calcined at temperatures of $800°$ to $900°$ C. for two hours, and this calcined material was wet ground using the ball mill, thereby to obtain a regulated powder.

Water or a binder such as polyvinyl alcohol was then added to this regulated powder, followed by pressing and then, the regulated powder was held at temperatures of $1150°$ to $1250°$ C. for two hours, followed by sintering. A ceramic thus obtained was ground in the shape of a disc having a diameter of 10 mm and having a thickness of 1 mm, and silver electrodes were provided baked in both ends thereof by baking and then, the ceramic was subjected to polarization processing in an electric field of 2 to 3 kv/mm in insulating oil having a temperature of $80°$ C., to obtain a piezoelectric ceramic. For comparison, a piezoelectric ceramic outside the range in the present invention was fabricated in the same operation as described above.

Measurements of electromechanical coupling factor Kp, mechanical quality factor Qm, and Curie temperature Tc in the vibration in the diameter direction were performed with respect to piezoelectric ceramics in the examples of the present invention and piezoelectric ceramics in the comparative examples obtained in the above described manner. The results of the measurements in the examples in which compositions are varied and the comparative examples are shown in Table 1.

In Table 1, A, B, C and D respectively represent components in the following formula (1) and the amounts of addition thereof:

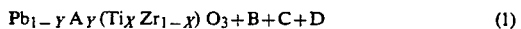

$$Pb_{1-Y}A_Y(Ti_X Zr_{1-X})O_3 + B + C + D \quad (1)$$

A represents the element (Sr, Ba, Ca) substituted for Pb and the ratio (molar ratio) thereof. B represents the additive ($Sb_2O_3$, $Nb_2O_5$, $Ta_2O_5$) and the amount of addition (% by weight) thereof. C represents the additive ($Cr_2O_3$, $Fe_2O_3$, $MnO_2$) and the amount of addition (% by weight) thereof. D represents the additive ($SiO_2$, $GeO_2$) and the amount of addition (% by weight) thereof. In Table 1, mark "*" indicates the piezoelectric ceramic in the comparative example is outside the range in the present invention.

According to the present invention, 0.1 to 8 mole % of a Pb atom in lead titanate zirconate is replaced with at least one selected from the group consisting of Sr, Ba and Ca. As can be seen from sample No. 4 in Table 1, when this amount of replacement exceeds 0.08 mole, i.e., 8 mole %, the Curie temperature Tc is not more than $250°$ C.

Furthermore, when the piezoelectric ceramic composition is used as a material for a ceramic filter element, it is essential that the rates of variation with temperature of a resonance frequency Fr and an antiresonance frequency Fa are low. In piezoelectric ceramics represented by the following formula (2) in which the content of Sr, Ba or Ca, i.e., the value of Y is varied, for example, 0.00, 0.03 and 0.05, the relationship between the rate of variation with temperature of the resonance frequency Fr at temperatures of $-20°$ to $80°$ C. (which is represented by (Fr—TC) (temperature coefficient)) and a molar ratio X of Ti is examined:

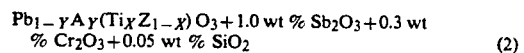

$$Pb_{1-Y}A_Y(Ti_X Zr_{1-X})O_3 + 1.0 \text{ wt \% } Sb_2O_3 + 0.3 \text{ wt \% } Cr_2O_3 + 0.05 \text{ wt \% } SiO_2 \quad (2)$$

The results thereof are shown in FIG. 1.

As can be seen from FIG. 1, when the value of Y is 0.00, the rate of variation of Fr with temperature (Fr—TC) largely varies with changes in the molar ratio X of Ti, thereby to make it very difficult to suppress the absolute value of the rate of variation of Fr with temperature (Fr—TC) to not more than 100 ppm/$°C$. On the other hand, when the value of Y is 0.03 and 0.05, the variation range of the rate of variation of Fr with temperature (Fr—TC) is decreased. Consequently, it is necessary that the amount of replacement of the Pb atom is not less than 0.1 mole %. In the present invention, the more favorable amount of replacement of the Pb atom is 1 to 6 mole %. If the amount of replacement is less than 1 mole %, the variation range of the rate of variation of Fr with temperature (Fr—TC) becomes large particularly when the molar ratio of Ti is in the neighborhood of 0.48. On the other hand, if the amount of replacement exceeds 6 mole %, the electromechanical coupling factor K tends to be slightly decreased.

In the present invention, the amount of addition of at least one element selected from the group consisting of Sb, Nb and Ta is 0.5 to 1.9% by weight. As indicated by sample No. 7 in Table 1, if this amount of addition is less than 0.5% by weight, abnormal grain growth occurs, thereby to make it impossible to achieve uniform sintering, so that the mechanical quality factor Qm is more than 400. On the other hand, as indicated by sample No. 11 in Table 1, if this amount of addition exceeds 1.9% by weight, the Curie temperature Tc is not more than $250°$ C. In the present invention, the more favorable amount of addition is 0.7 to 1.5% by weight. If the amount of addition is not less than 0.7% by weight, it is possible to obtain a mechanical quality factor Qm of not more than 350. On the other hand, if the amount of addition is not more than 1.5% by weight, it is possible to obtain a Curie temperature Tc of not less than $275°$ C.

In the present invention, the value of X for defining the ratio of Ti and Zr, that is, the value of X in ($Ti_X Zr_{1-X}$) is 0.48 to 0.55. As indicated by samples Nos. 23 and 24, in Table 1, if the value of X is less than 0.48, the Curie temperature Tc is lowered to degrade the heat proof. On the other hand, as indicated by sample No. 27 in Table 1, if the value of X is more than 0.55, the electromechanical coupling factor Kp is lowered to not more than 40%. The more favorable range of this value of X is 0.48 to 0.52. if the value of X is not more than 0.52, it is possible to obtain an electromechanical coupling factor Kp of not less than 43%.

Figure 2:
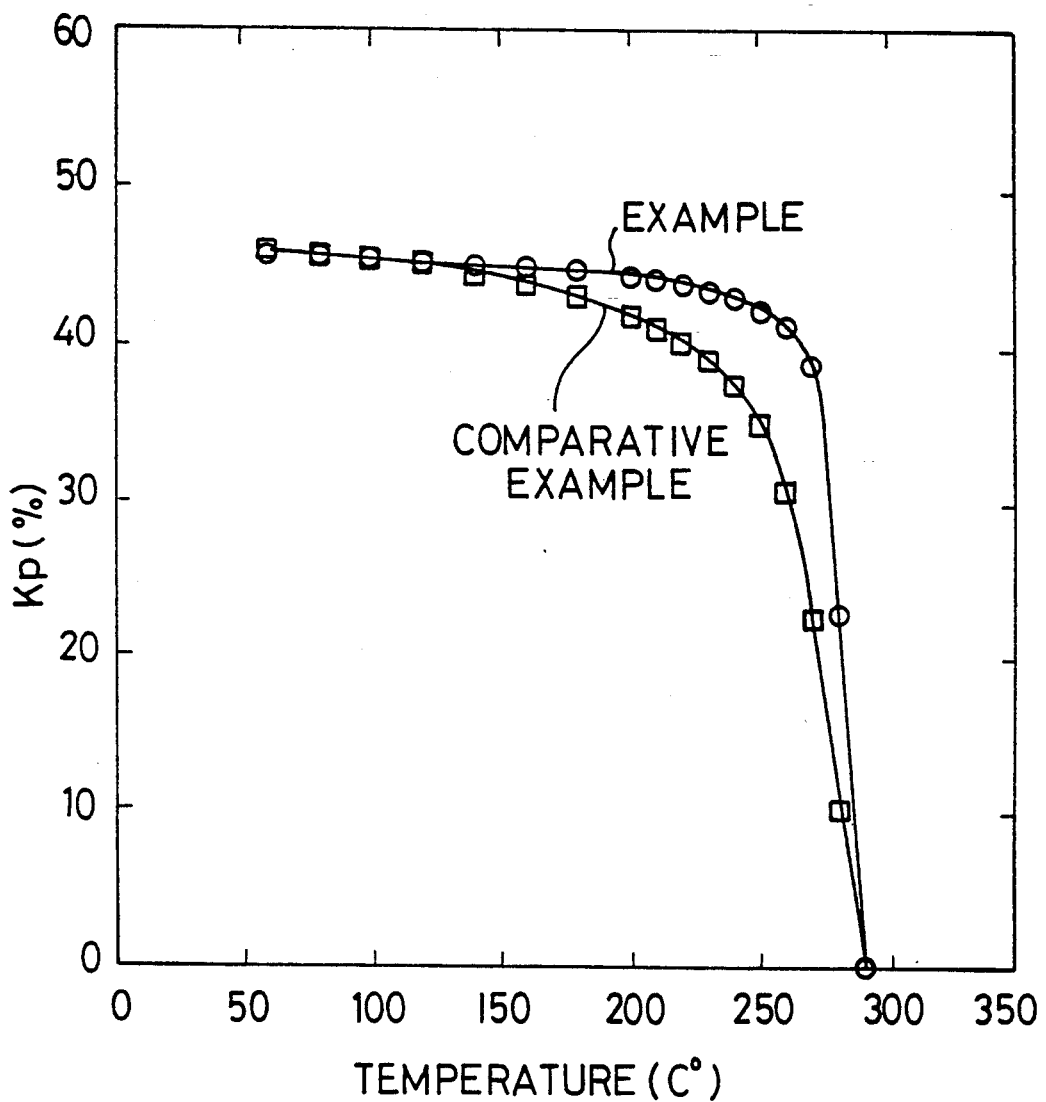
FIG. 2 is a diagram showing the relationship between temperatures and an electromechanical coupling factor Kp in a sample in the example of the present invention and a sample in the comparative example.

In the present invention, the amount of addition of at least one element selected from the group consisting of Cr, Fe and Mn is 0.1 to 0.8% by weight. FIG. 2 shows the relationship between temperatures and an electromechanical coupling factor Kp with respect to sample No. 17 which is the piezoelectric ceramic composition in the example of the present invention and sample No. 33 in the comparative example in which the amount of addition of Cr, Fe or Mn is less than 0.1% by weight which is outside the range in the present invention. The two samples are approximately equal in Curie temperature Tc and electromechanical coupling factor Kp. However, it is found that the piezoelectric ceramic composition according to the present invention in which the amount of addition of Cr, Fe or Mn is not less than 0.1% by weight is considerably superior in heat resistance as a material for a ceramic filter element because the rate of decrease of the electromechanical coupling factor Kp up to the vicinity of the Curie point, particularly in the vicinity of a temperature of 250° C., is lower, as compared with the piezoelectric ceramic composition in the comparative example.

On the other hand, if the amount of addition of Cr, Fe or Mn exceeds 0.8% by weight, the mechanical quality factor Qm is so high as to be not less than 400, and the electromechanical coupling factor Kp is lowered to not more than 40%, as indicated by sample No. 18 in Table 1. The more preferable amount of addition is 0.2 to 0.7% by weight. If the amount of addition is less than 0.2% by weight, the rate of decrease of the electromechanical coupling factor Kp is slightly raised. It is desirable that the electromechanical coupling factor Kp is not less than 40% at a temperature of 250° C. On the other hand, if the amount of addition is not more than 0.7% by weight, it is possible to obtain a mechanical quality factor Qm of not more than 350.

Figure 3:
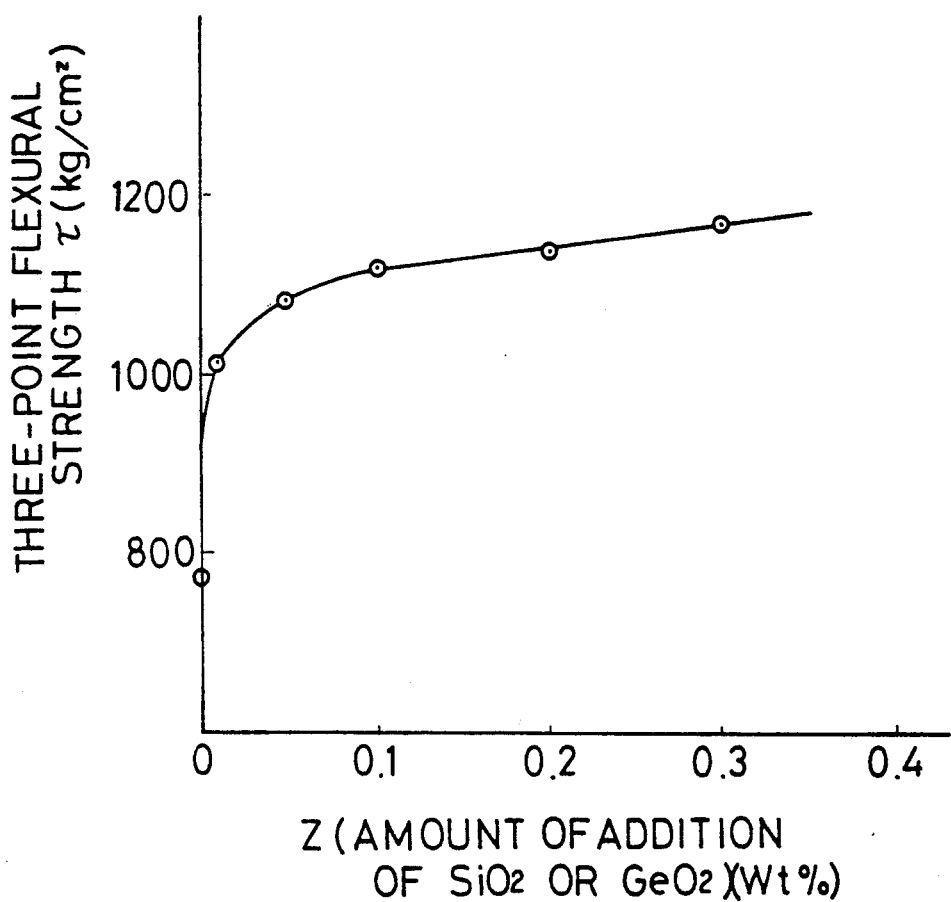
FIG. 3 is a diagram showing the relationship between the amount of addition of $SiO_2$ or $GeO_2$ and three-point flexural strength.

In the present invention, the amount of addition of at least one element selected from the group consisting of Si and Ge is 0.001 to 0.25% by weight. FIG. 3 shows the results of a three-point flexural strength test with respect to the piezoelectric ceramic composition in one example of the present invention. Three-point flexural strength (flexural strength) τ is measured by changing the value of Z in the composition represented by the following formula (3) (the amount of addition Of $SiO_2$ or $GeO_2$ (% by weight)):

$$Pb_{0.95} Ba_{0.05} (Ti_{0.49} Zr_{0.51}) O_3 + 1.0 \text{ wt \%}$$
$$Sb_2O_3 + 0.4 \text{ wt \% } Cr_2O_3 + ZD \text{ (where D is } SiO_2$$
$$\text{or } GeO_2) \tag{3}$$

The relationship between the three-point flexural strength τ and the value of Z is shown in FIG. 3.

As can be seen from FIG. 3, when D, i.e., the amount of addition of $SiO_2$ or $GeO_2$ is less than 0.01% by weight, τ is not more than 1000 kg/cm², so that the mechanical strength is lowered. In addition, as indicated by sample No. 31 in Table 1, if the value of D exceeds 0.25% by weight, the electromechanical coupling factor Kp is lowered to not more than 40%. Consequently, the amounts of addition of Si and Ge are preferably in the range of 0.001 to 0.25% by weight when converted into $SiO_2$ and $GeO_2$, respectively. Further, the more favorable range is 0.01 to 0.15% by weight. If the amount of addition is less than 0.01% by weight, the effect of increasing the strength may, in some cases, be insufficient. On the other hand, if the amount of addition exceeds 0.15% by weight, the electromechanical coupling factor Kp is slightly lowered, thereby to make it difficult to obtain 43% which is a favorable value as Kp.

Although the present invention has been described and illustrated in detail, it is clearly understood that the same is by way of illustration and example only and is not to be taken by way of limitation, the spirit and scope of the present invention being limited only by the terms of the appended claims.

TABLE 1

| No. | A | (mol) | B | (wt %) | C | (wt %) | D | (wt %) | X | (mol) | Kp (%) | Qm | Tc (°C.) |
|---|---|---|---|---|---|---|---|---|---|---|---|---|---|
| 1 | Sr | 0.03 | Sb₂O₃ | 1.0 | Cr₂O₃ | 0.3 | SiO₂ | 0.05 | | 0.5 | 45.6 | 165 | 310 |
| 2 | Sr | 0.05 | Sb₂O₃ | 1.0 | Cr₂O₃ | 0.3 | SiO₂ | 0.05 | | 0.5 | 43.5 | 168 | 290 |
| 3 | Sr | 0.07 | Sb₂O₃ | 1.0 | Cr₂O₃ | 0.3 | SiO₂ | 0.05 | | 0.5 | 41.8 | 170 | 280 |
| * 4 | Sr | 0.11 | Sb₂O₃ | 1.0 | Cr₂O₃ | 0.3 | SiO₂ | 0.05 | | 0.5 | 37.3 | 175 | 235 |
| 5 | Ba | 0.05 | Sb₂O₃ | 1.0 | Cr₂O₃ | 0.3 | SiO₂ | 0.05 | | 0.5 | 46.3 | 165 | 315 |
| 6 | Ca | 0.05 | Sb₂O₃ | 1.0 | Cr₂O₃ | 0.3 | SiO₂ | 0.05 | | 0.5 | 41.4 | 170 | 305 |
| * 7 | Ba | 0.05 | Sb₂O₃ | 0.4 | Cr₂O₃ | 0.4 | SiO₂ | 0.05 | | 0.49 | 43.7 | 510 | 340 |
| 8 | Ba | 0.05 | Sb₂O₃ | 0.8 | Cr₂O₃ | 0.4 | SiO₂ | 0.05 | | 0.49 | 49.2 | 284 | 325 |
| 9 | Ba | 0.05 | Sb₂O₃ | 1.2 | Cr₂O₃ | 0.4 | SiO₂ | 0.05 | | 0.49 | 52.9 | 175 | 300 |
| 10 | Ba | 0.05 | Sb₂O₃ | 1.6 | Cr₂O₃ | 0.4 | SiO₂ | 0.05 | | 0.49 | 55.6 | 85 | 265 |
| * 11 | Ba | 0.05 | Sb₂O₃ | 2.0 | Cr₂O₃ | 0.4 | SiO₂ | 0.05 | | 0.49 | 57.2 | 65 | 230 |
| 12 | Ba | 0.03 | Sb₂O₃ Nb₂O₅ | 0.8 0.4 | Cr₂O₃ | 0.3 | SiO₂ | 0.05 | | 0.49 | 51.7 | 135 | 300 |
| 13 | Ba | 0.03 | Sb₂O₃ Nb₂O₅ | 0.4 0.8 | Cr₂O₃ | 0.3 | SiO₂ | 0.05 | | 0.49 | 50.2 | 125 | 305 |
| 14 | Ba | 0.03 | Nb₂O₅ | 1.2 | Cr₂O₃ | 0.3 | SiO₂ | 0.05 | | 0.49 | 48.5 | 122 | 310 |
| 15 | Ba | 0.03 | Sb₂O₃ Ta₂O₅ | 0.6 0.6 | Cr₂O₃ | 0.3 | SiO₂ | 0.05 | | 0.49 | 50.1 | 130 | 305 |
| 16 | Sr | 0.05 | Sb₂O₃ | 1.3 | Cr₂O₃ | 0.3 | SiO₂ | 0.05 | | 0.49 | 48.7 | 208 | 275 |
| 17 | Sr | 0.05 | Sb₂O₃ | 1.3 | Cr₂O₃ | 0.6 | SiO₂ | 0.05 | | 0.49 | 45.3 | 310 | 280 |
| * 18 | Sr | 0.05 | Sb₂O₃ | 1.3 | Cr₂O₃ | 0.9 | SiO₂ | 0.05 | | 0.49 | 34.3 | 550 | 280 |
| 19 | Sr | 0.05 | Sb₂O₃ | 1.3 | Cr₂O₃ Fe₂O₃ | 0.1 0.2 | SiO₂ | 0.05 | | 0.49 | 48.5 | 220 | 275 |
| 20 | Sr | 0.05 | Sb₂O₃ | 1.3 | Fe₂O₃ | 0.3 | SiO₂ | 0.05 | | 0.49 | 48.6 | 225 | 285 |
| 21 | Sr | 0.05 | Sb₂O₃ | 1.3 | Cr₂O₃ MnO₂ | 0.1 0.2 | SiO₂ | 0.05 | | 0.49 | 49.0 | 250 | 280 |
| 22 | Sr | 0.05 | Sb₂O₃ | 1.3 | MnO₂ | 0.3 | SiO₂ | 0.05 | | 0.49 | 49.1 | 285 | 285 |
| * 23 | Sr | 0.04 | Sb₂O₃ | 1.3 | Cr₂O₃ | 0.4 | SiO₂ | 0.05 | | 0.44 | 44.3 | 120 | 240 |
| * 24 | Sr | 0.04 | Sb₂O₃ | 1.3 | Cr₂O₃ | 0.4 | SiO₂ | 0.05 | | 0.47 | 59.9 | 135 | 275 |
| 25 | Sr | 0.04 | Sb₂O₃ | 1.3 | Cr₂O₃ | 0.4 | SiO₂ | 0.05 | | 0.50 | 48.7 | 190 | 290 |
| 26 | Sr | 0.04 | Sb₂O₃ | 1.3 | Cr₂O₃ | 0.4 | SiO₂ | 0.05 | | 0.53 | 40.1 | 235 | 295 |
| * 27 | Sr | 0.04 | Sb₂O₃ | 1.3 | Cr₂O₃ | 0.4 | SiO₂ | 0.05 | | 0.56 | 27.9 | 388 | 310 |

TABLE 1-continued

| No. | A (mol) | | B (wt %) | | C (wt %) | | D (wt %) | | X (mol) | Kp (%) | Qm | Tc (°C.) |
|---|---|---|---|---|---|---|---|---|---|---|---|---|
| 28 | Ba | 0.05 | $Sb_2O_3$ | 1.0 | $Cr_2O_3$ | 0.4 | $SiO_2$ | 0.05 | 0.49 | 51.0 | 250 | 315 |
| 29 | Ba | 0.05 | $Sb_2O_3$ | 1.0 | $Cr_2O_3$ | 0.4 | $SiO_2$ | 0.10 | 0.49 | 47.2 | 245 | 310 |
| 30 | Ba | 0.05 | $Sb_2O_3$ | 1.0 | $Cr_2O_3$ | 0.4 | $SiO_2$ | 0.20 | 0.49 | 42.7 | 238 | 305 |
| *31 | Ba | 0.05 | $Sb_2O_3$ | 1.0 | $Cr_2O_3$ | 0.4 | $SiO_2$ | 0.30 | 0.49 | 36.2 | 220 | 295 |
| 32 | Ba | 0.05 | $Sb_2O_3$ | 1.0 | $Cr_2O_3$ | 0.4 | $SiO_2$ $GeO_2$ | 0.05 0.05 | 0.49 | 46.9 | 250 | 310 |
| *33 | Sr | 0.05 | $Sb_2O_3$ | 1.3 | — | | $SiO_2$ | 0.05 | 0.49 | 45.6 | 150 | 285 |

What is claimed is:

1. A piezoelectric ceramic composition containing lead titanate zirconate represented by a composition formula Pb $(Ti_X Zr_{1-X}) O_3$ (where X=0.48 to 0.55), 0.1 to 8 mole % of a Pb atom in said lead titanate zirconate being replaced with at least one element selected from the group consisting of Ba, Sr and Ca, which contains 0.5 to 1.9% by weight of at least one element selected from the group consisting of Sb, Nb and Ta when respectively converted into $Sb_2O_3$, $Nb_2O_5$ and $Ta_2O_5$, 0.1 to 0.8% by weight of at least one element selected from the group consisting of Cr, Fe and Mn when respectively converted into $Cr_2O_3$, $Fe_2O_3$ and $MnO_2$, and 0.001 to 0.25% by weight of at least one element selected from the group consisting of Si and Ge when respectively converted into $SiO_2$ and $GeO_2$.

2. The piezoelectric ceramic composition according to claim 1, wherein 1 to 6 mole % of the Pb atom in said lead titanate zirconate is replaced with at least one element selected from the group consisting of Ba, Sr and Ca.

3. The piezoelectric ceramic composition according to claim 1, wherein 0.7 to 1.5% by weight of at least one element selected from the group consisting of Sb, Nb and Ta is present when respectively converted into $Sb_2O_3$, $Nb_2O_5$ and $Ta_2O_5$.

4. The piezoelectric ceramic composition according to claim 1, wherein X in the composition formula representing said titanate zirconate is 0.48 to 0.52.

5. The piezoelectric ceramic composition according to claim 1, wherein 0.2 to 0.7% by weight of at least one element selected from the group consisting of Cr, Fe and Mn is present when respectively converted into $Cr_2O_3$, $Fe_2O_3$ and $MnO_2$.

6. The piezoelectric ceramic composition according to claim 1, wherein 0.01 to 0.15% by weight of at least one element selected from the group consisting of Si and Ge is present when respectively converted into $SiO_2$ and $GeO_2$.

7. The piezoelectric ceramic composition according to claim 1, which has an electromechanical coupling factor Kp of not less than 40%.

8. The piezoelectric ceramic composition according to claim 1, which has a mechanical quality factor Qm of not more than 400.

9. The piezoelectric ceramic composition according to claim 1, which has a Curie temperature of not less than 250° C.

10. The piezoelectric ceramic composition according to claim 2, wherein 0.7 to 1.5% by weight of at least one element selected from the group consisting of Sb, Nb and Ta is present when respectively converted into $Sb_2O_3$, $Nb_2O_5$ and $Ta_2O_5$, wherein X in the composition formula representing said titanate zirconate is 0.48 to 0.52, wherein 0.2 to 0.5% by weight of at least one element selected from the group consisting of Cr, Fe and Mn is present when converted into $Cr_2O_3$, $Fe_2O_3$ and $MnO_2$, and wherein 0.01 to 0.15% by weight of at least one element selected from the group consisting of Si and Ge is present when respectively converted into $SiO_2$ and $GeO_2$.

11. The piezoelectric ceramic composition according to claim 1, the member of the group of Cr, Fe and Mn is Cr or Fe, the member of the group of Sb, Nb and Ta is Sb or Ta and the member of the group of Si and Ge is Si.

12. The piezoelectric ceramic composition according to claim 1 containing lead titanate zirconate in which 3 to 7 mol % of lead has been replaced with Ba, Sr or Ca, 0.5-1.6% by weight of $Sb_2O_3$, 0.1-0.6% by weight of $Cr_2O_3$ and 0.01-0.15 of $SiO_2$.

* * * * *